US008508438B2

(12) United States Patent
Suh (10) Patent No.: US 8,508,438 B2
(45) Date of Patent: Aug. 13, 2013

(54) ORGANIC LIGHT EMITTING DISPLAY WITH REDUCED DEAD SPACE

(75) Inventor: Mi-Sook Suh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 244 days.

(21) Appl. No.: 12/856,551

(22) Filed: Aug. 13, 2010

(65) Prior Publication Data

US 2011/0248965 A1    Oct. 13, 2011

(30) Foreign Application Priority Data

Apr. 13, 2010  (KR) .................. 10-2010-0033821

(51) Int. Cl.
*G09G 3/30* (2006.01)
*H01J 1/62* (2006.01)
*H01J 63/04* (2006.01)

(52) U.S. Cl.
USPC ............................................ 345/76; 313/483

(58) Field of Classification Search
USPC ..... 345/76–83, 204–215, 690–699; 349/143; 313/483–512
See application file for complete search history.

(56) References Cited

U.S. PATENT DOCUMENTS

| 6,636,286 | B1 * | 10/2003 | Baek ............................ 349/114 |
| 2002/0088984 | A1 * | 7/2002 | Toda et al. .................... 257/99 |
| 2002/0109651 | A1 | 8/2002 | Oh |
| 2006/0055633 | A1 | 3/2006 | Koyama |
| 2007/0030233 | A1 | 2/2007 | Chai et al. |
| 2009/0021155 | A1 * | 1/2009 | Oda ............................. 313/504 |

FOREIGN PATENT DOCUMENTS

| EP | 1655781 A2 * | 5/2006 |
| JP | 05-313604 | 11/1993 |
| JP | 2001-175199 | 6/2001 |
| JP | 2001-194645 * | 7/2001 |
| JP | 2002-221917 | 8/2002 |
| JP | 2003-076315 | 3/2003 |
| JP | 2003-330037 | 11/2003 |
| JP | 2005-100724 | 4/2005 |
| JP | 2005-250108 | 9/2005 |
| JP | 2007-41588 A | 2/2007 |
| JP | 2008-71468 | 3/2008 |

(Continued)

OTHER PUBLICATIONS

EP Office action for EP 10193157.4 dated Apr. 15, 2011 (12 pages).

(Continued)

*Primary Examiner* — Dwayne Bost
*Assistant Examiner* — Larry Sternbane
(74) *Attorney, Agent, or Firm* — Christie, Parker & Hale, LLP (57) ABSTRACT

An organic light emitting display with a reduced dead space. The organic light emitting display includes a scan driver for supplying scan signals to a plurality of scan lines; a data driver for supplying data signals to a plurality of data lines; and a pixel region including a plurality of pixels at crossing regions of the scan lines with the data lines. The pixels include organic light emitting diodes (OLEDs) and pixel circuits for controlling currents flowing to the OLEDs. The scan lines are arranged to extend along a vertical direction of a screen realized in the pixel region. The data lines are arranged to extend along a horizontal direction of the screen. The pixels are configured to horizontally display an image on the screen.

14 Claims, 4 Drawing Sheets

(56) References Cited

FOREIGN PATENT DOCUMENTS

| | | |
|---|---|---|
| JP | 2008-242206 | 10/2008 |
| KR | 10-20060124084 A | 12/2006 |
| KR | 10-20060124849 A | 12/2006 |
| KR | 10-20080020156 A | 3/2008 |
| WO | WO 2008/072704 A1 | 6/2008 |

OTHER PUBLICATIONS

KIPO Office Action dated Aug. 30, 2011, for Korean Priority Patent Application No. 10-2010-0033821, 1 page.
Japanese Patent Office Decision of Grant, dated Jan. 8, 2013, issued in corresponding JP Application No. 2010-162016 (3 pages).

* cited by examiner

ORGANIC LIGHT EMITTING DISPLAY WITH REDUCED DEAD SPACE

CROSS-REFERENCE TO RELATED APPLICATION

This application claims priority to and the benefit of Korean Patent Application No. 10-2010-0033821, filed on Apr. 13, 2010, in the Korean Intellectual Property Office, the entire content of which is incorporated herein by reference.

BACKGROUND

1. Field

The following description relates to an organic light emitting display, and more particularly, to an organic light emitting display in which a dead space is reduced.

2. Description of the Related Art

Various flat panel displays (FPD) having smaller weight and volume than a comparable cathode ray tube (CRT) are being developed.

Among the FPDs, an organic light emitting display displays an image using organic light emitting diodes (OLED) that are self-emission elements. Therefore, the organic light emitting display has high brightness and color purity and is considered as a next generation display.

The panel of the organic light emitting display includes a pixel region (display region) having a plurality of pixels positioned at the crossing regions of scan lines with data lines, a scan driver for supplying scan signals to pixels through the scan lines, and a data driver for supplying data signals to the pixels through the data lines.

In the context of embodiments of the present invention, the region excluding the pixel region from the entire region of the panel is referred to as a dead space. In general, wiring lines such as signal lines or power source lines are arranged in the dead space together with the scan driver and/or the data driver.

Since the dead space limits the ratio of the area occupied by the pixel region in the entire region of the panel, there is a need to reduce the dead space.

SUMMARY

An aspect of an embodiment of the present invention is directed toward an organic light emitting display in which a dead space is reduced.

In order to achieve the foregoing and/or other aspects of the present invention, an embodiment of the present invention provides an organic light emitting display, including: a scan driver for supplying scan signals to a plurality of scan lines; a data driver for supplying data signals to a plurality of data lines; and a pixel region including a plurality of pixels at crossing regions of the scan lines with the data lines. The pixels include organic light emitting diodes (OLEDs) and pixel circuits for controlling currents flowing to the OLEDs. The scan lines are arranged to extend along a vertical direction of a screen realized in the pixel region. The data lines are arranged to extend along a horizontal direction of the screen. The pixels are configured to horizontally display an image on the screen.

In the pixels and according to one embodiment, major axes of anode electrodes constituting the OLEDs and major axes of pixel circuit regions, where the pixel circuits are formed, are arranged to cross each other. In one embodiment, the OLEDs and the pixel circuits coupled to the OLEDs are arranged to at least partially overlap each other.

In the pixels and according to one embodiment, anode electrodes constituting the OLEDs are patterned in a pattern so that the anode electrodes are longer along the vertical direction than along the horizontal direction; and pixel circuit regions, where the pixel circuits are formed, are configured so that the pixel circuit regions are longer along the horizontal direction than along the vertical direction. In one embodiment, emission regions of the pixels are configured so that the emission regions are longer along the vertical direction than along the horizontal direction to correspond to the pattern of the anode electrodes.

In one embodiment, the pixels are unit pixels; each of the unit pixels includes a red pixel, a green pixel, and a blue pixel; the red pixel, the green pixel, and the blue pixel of the unit pixel are commonly coupled to a same scan line of the scan lines arranged along a column, where the unit pixel is arranged; and the red pixel, the green pixel, and the blue pixel of the unit pixel are respectively coupled to different data lines of the data lines along a row, where the unit pixel is arranged. In one embodiment, anode electrodes of the OLEDs included in the pixels each cross at least two data lines of the data lines.

In one embodiment, the scan driver is arranged in an upper or lower side of the pixel region.

In one embodiment, the organic light emitting display device further includes: a plurality of emission control lines for controlling emission time of the OLEDs, the emission control lines being configured to extend in parallel with the scan lines in the pixel region; and an emission control driver for supplying emission control signals to the emission control lines, the emission controller being arranged in an upper or lower side of the pixel region. In one embodiment, the emission control driver is arranged to face the scan driver with the pixel region interposed therebetween.

In one embodiment, the data driver is arranged on a left or right side of the pixel region. In one embodiment, the data lines are directly coupled from the pixel region to the data driver via a wiring line region between the pixel region and the data driver without passing through an upper or lower side of the pixel region. In one embodiment, the scan lines, the data lines, and pixel circuit regions, where the pixel circuits are formed, are configured as a portrait type panel; and the portrait type panel is configured to be rotated to extend along a horizontal direction; and a major axis of anode electrodes of the OLEDs positioned on the pixel circuit regions and a major axis of emission regions corresponding to the anode electrodes are rotated in a direction orthogonal to a major axis of the pixel circuit regions to horizontally display an image on the screen.

In view of the foregoing and according to an embodiment of the present invention, a landscape type organic light emitting display, where an image is horizontally displayed on a screen, is provided with a configuration in which a dead space is effectively reduced.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to another element or be indirectly connected to another element with one or more intervening elements interposed therebetween. Hereinafter, like reference numerals refer to like elements.

Hereinafter, embodiments of the present invention will be described in more detail with reference to the attached drawings.

Figure 1:
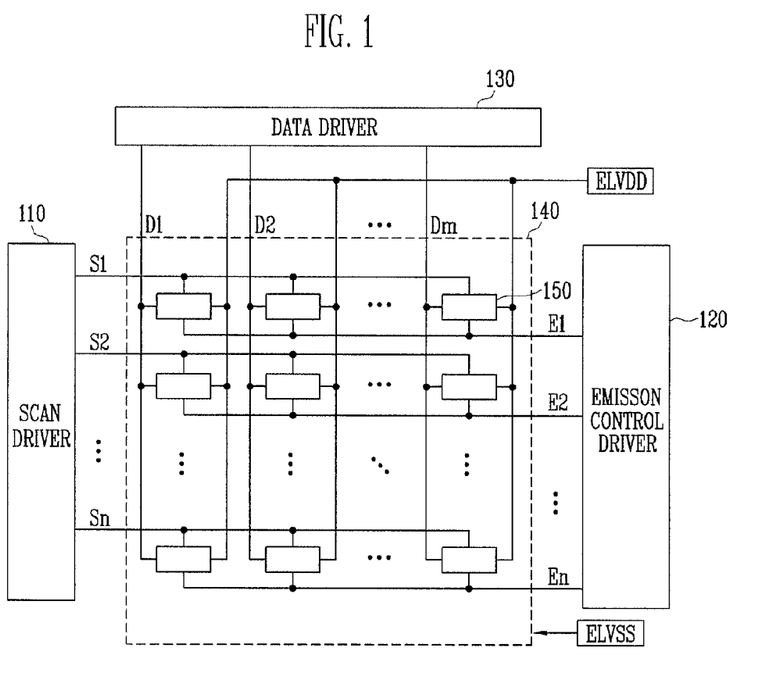
FIG. 1 is a block diagram schematically illustrating the structure of an organic light emitting display.
Figure 2A:
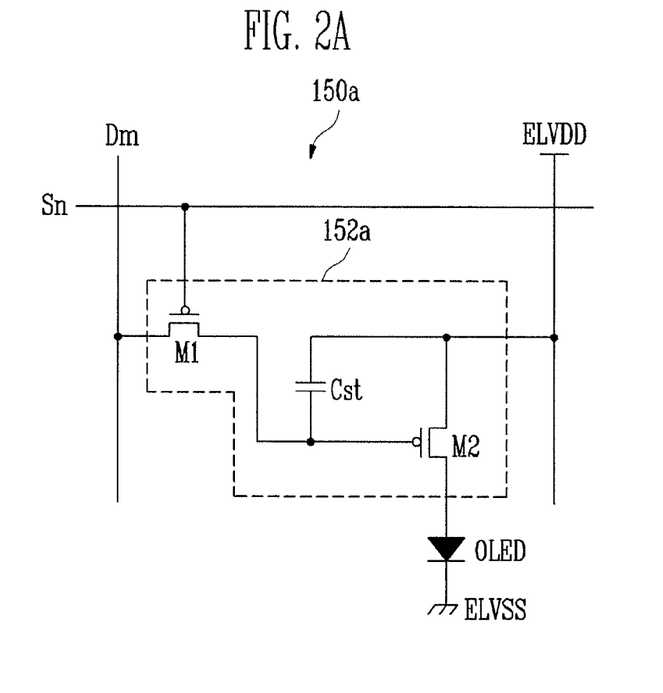
FIGS. 2A to 2C are circuit diagrams illustrating embodiments of a pixel included in the organic light emitting display of FIG. 1.
Figure 2B:
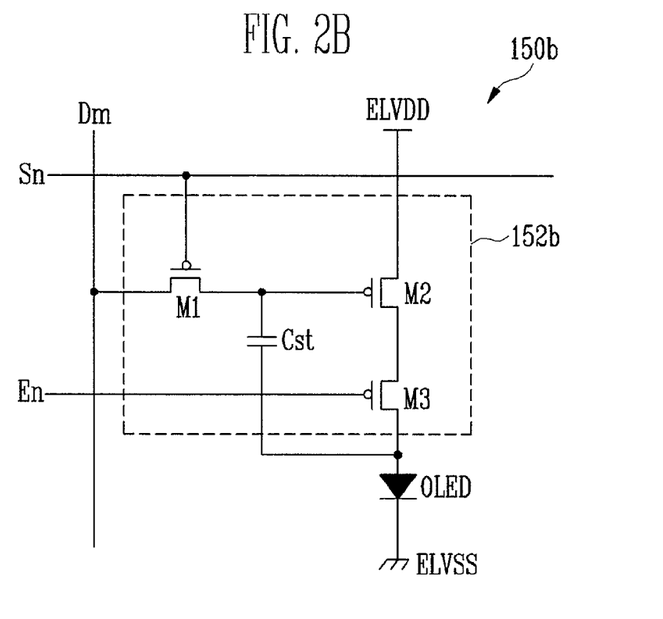
Figure 2C:
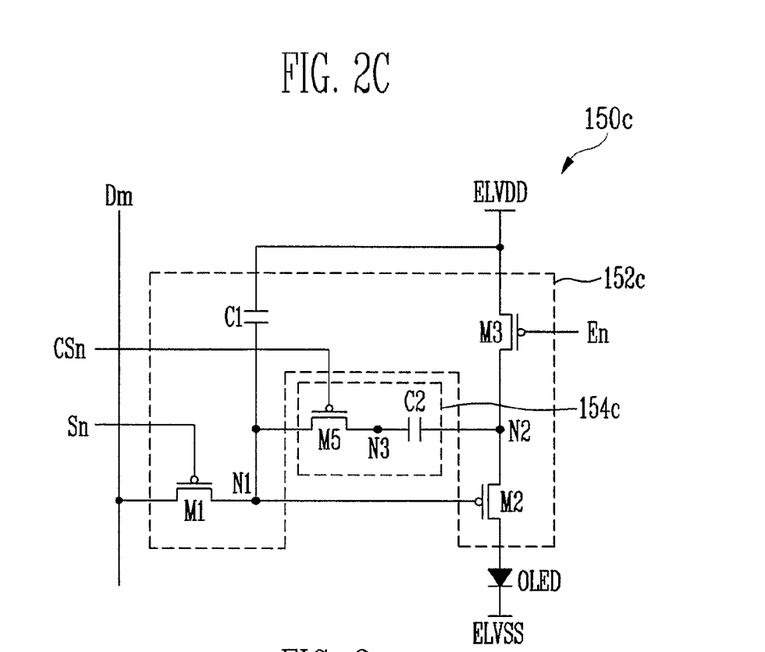
Figure 3:
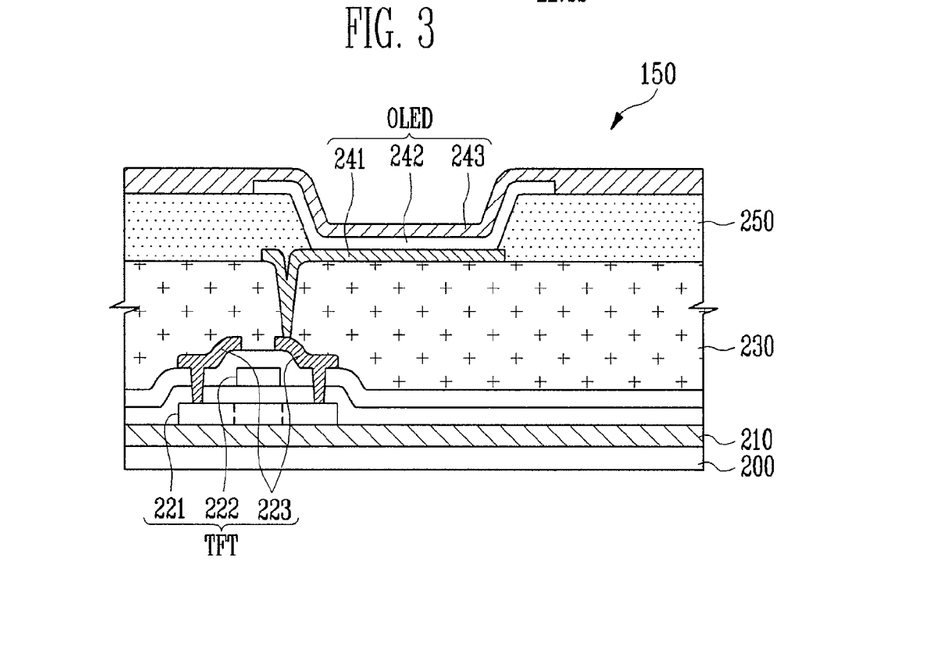
FIG. 3 is a sectional view of a main part of the pixel of FIGS. 2A to 2C.

FIG. 1 is a block diagram schematically illustrating the structure of an organic light emitting display. FIGS. 2A to 2C are circuit diagrams illustrating embodiments of a pixel included in the organic light emitting display of FIG. 1. FIG. 3 is a sectional view of a main part of the pixel of FIGS. 2A to 2C.

First, referring to FIG. 1, the organic light emitting display includes a scan driver 110, an emission control driver 120, a data driver 130, and a pixel region (display region) 140 having a plurality of pixels 150 for displaying an image in accordance with scan signals, emission control signals, and data signals supplied from the scan driver 110, the emission control driver 120, and the data driver 130.

The scan driver 110 sequentially supplies the scan signals to scan lines S1 to Sn in accordance with control signals supplied from an external control circuit, for example, a timing controller. Then, the pixels 150 are selected by the scan signals to sequentially receive the data signals.

The emission control driver 120 sequentially supplies the emission control signals to emission control lines E1 to En in accordance with the control signals supplied from the outside such as the timing controller. Then, the emission of the pixels 150 is controlled by the emission control signals. That is, the emission control signals control the emission time of the pixels 150. The emission control driver 120 may be omitted in accordance with the internal structure of the pixels 150. For example, in the case of the organic light emitting display including the pixel illustrated in FIG. 2A to be described later in more detail, the emission control driver 120 may be omitted.

The scan driver 110 and the emission control driver 120 may be additionally mounted in the form of a chip, and/or may be built in on a panel together with pixel circuit elements included in the pixel region 140 to constitute a built-in circuit unit.

The data driver 130 supplies the data signals to data lines D1 to Dm in accordance with the control signals supplied from the outside such as the timing controller. The data signals supplied to the data lines D1 to Dm are supplied to the pixels 150 selected by the scan signals whenever the scan signals are supplied. Then, the pixels 150 charge (store) voltages corresponding to the data signals and emit light with brightness components corresponding to the voltages.

The pixel region 140 includes the plurality of pixels 150 positioned at crossing regions of the scan lines S1 to Sn and the emission control lines E1 to En with the data lines D1 to Dm. The pixels 150 include organic light emitting diodes that emit light with brightness or brightness levels that are determined/controlled by driving currents corresponding to the data signals and pixel circuits for controlling the driving currents that flow to the OLEDs.

The pixel region 140 receives a voltage from a high potential pixel power source ELVDD from the outside and a voltage from a low potential pixel power source ELVSS from the outside. The voltage of the high potential pixel power source ELVDD and the voltage of the low potential pixel power source ELVSS are supplied to the pixels 150. Then, the pixels 150 emit light with brightness components corresponding to the driving currents that flow from the high potential pixel power source ELVDD to the low potential pixel power source ELVSS via the OLEDs to correspond to the data signals.

Here, the high potential pixel power source ELVDD is electrically coupled to the anode electrodes of the OLEDs in the emission period of the pixels 150, and the low potential pixel power source ELVSS is electrically coupled to the cathode electrodes of the OLEDs.

Here, one of the anode electrode and the cathode electrode of the OLED may be entirely formed on the pixel region 140 and the other electrode may be patterned to correspond to each of the pixels 150. For example, the anode electrode may be patterned in each of the pixels 150 and the cathode electrode may be entirely formed on the pixel region 140.

In one embodiment, each of the pixels 150 may be formed with a red pixel that emits red light, a green pixel that emits green light, and/or a blue pixel that emits blue light. That is, in one embodiment, the plurality of pixels 150 included in the pixel region 140 include red pixels, green pixels, and blue pixels. At least one adjacent red pixel, one adjacent green pixel, and one adjacent blue pixel constitutes a unit pixel. Therefore, the unit pixel emits light with brightness corresponding to the driving current with various colors so that a color image can be displayed on a screen realized in the pixel region 140.

Each of the pixels 150 may be realized to have various suitable forms. In one embodiment, as illustrated in FIG. 2A, a pixel 150a includes a pixel circuit 152a having a switching transistor M1 for transmitting a data signal from the data line Dm to the inside of the pixel 150a in accordance with a scan signal supplied from the scan line Sn, a storage capacitor Cst for storing the data signal, and a driving transistor M2 for supplying the driving current corresponding to the data signal to an OLED and the OLED for emitting light with brightness corresponding to the driving current.

In addition, as illustrated in FIGS. 2B and 2C, each of the pixels 150 may further include at least one transistor and capacitor for compensating the threshold voltage of the driving transistor M2 and/or the deterioration of the OLED.

Pixels 150a, 150b, and 150c illustrated in FIGS. 2A to 2C have suitable structures that are operated with suitable operations.

In FIGS. 2A to 2C, for consistency of reference numerals, pixels are denoted by the reference numerals 150a, 150b, and 150c, pixel circuits are denoted by reference numerals 152a, 152b, and 152c, and the compensating unit of FIG. 2C is denoted by a reference numeral 154c.

Here, in embodiments of the present invention, the pixel circuits and the OLEDs are arranged in different layers. For example, as illustrated in FIG. 3, the OLEDs may be positioned on a layer differing from the layer where the pixel circuits are positioned.

In FIG. 3, among the components included in the pixel circuit, only one transistor TFT directly coupled to the OLED is illustrated. However, the remaining transistor(s) or capacitor(s) may be simultaneously or concurrently or commonly formed in the same layer in a process of forming the transistor TFT.

In FIG. 3, 200, 210, 221, 222, 223, 230, 241, 242, 243, and 250 denote a substrate, a buffer layer, a semiconductor layer, a gate electrode, source/drain electrodes, a planarization layer, an anode electrode, a light emitting layer, a cathode electrode, and a pixel defining layer, respectively.

In the pixel 150, light is generated by a region in which the emission layer 242 is laminated on the anode electrode 241 exposed by the pixel defining layer 250. That is, the emission region of the pixel 150 may be set to correspond to the pattern of the anode electrode 241.

Here, for convenience of description and according to embodiments of the present invention, it is described that the anode electrode 241 of the OLED is patterned in each of the pixels 150 and that the cathode electrode 243 is entirely formed on the pixel region. However, the present invention is not limited to the above. For example, when the type of the transistor TFT or the pixel circuit changes, the anode electrode 241 of the OLED may be entirely formed in the pixel region, and the cathode electrode 243 may be patterned in each of the pixels 150.

The organic light emitting display described with reference to FIGS. 1 to 3 may be divided into a landscape type and a portrait type in accordance with the display direction of a screen. In the landscape type, the horizontal width of the screen is set to be larger than the vertical height of the screen to display a horizontal image. By contrast, in the portrait type, the vertical height of the screen is set to be larger than the horizontal width to display a vertical image.

The landscape type is suitable for watching movies. Demand of the landscape type is rapidly increasing.

In the landscape type, in general, a dead space in a panel is large.

In particular, in a landscape type panel, since the scan lines S1 to Sn are coupled in the horizontal direction of a screen and the data lines D1 to Dm are coupled in the vertical direction of the screen, the scan driver 110 (and/or the emission control driver 120) is arranged on the left or right of the screen and the data driver 130 is arranged in the upper or lower side of the screen. In this case, the number of pixels 150 coupled to the scan lines S of the landscape type panel is large so that the size of a buffer circuit provided in the scan driver 110 increases and the fan-out angle of the data lines D1 to Dm fan-out from the data driver 130 is large so that the dead space is large.

In addition, the data driver 130 may be arranged on the left or right of the screen from the outside of the seal up region of the panel. In this case, since the data lines D1 to Dm drawn from the data driver 130 must be coupled to the pixels 150 via a dummy region in the upper or lower side of the screen, the dead space in the upper or lower side of the screen increases.

In particular, unlike the scan lines S1 to Sn that are commonly coupled to the unit pixel, which includes the red pixel, the green pixel, and the blue pixel, since the data lines D1 to Dm are separately formed in each of the red pixel, the green pixel, and the blue pixel in order to supply different data signals to the red pixel, the green pixel, and the blue pixels, the number of data lines is comparably large and the dead space in the upper or lower side is also relatively large.

In addition, in this case, in order to secure stability between the data lines D1 to Dm, the odd data lines D1, D3, . . . , and Dm−1 and the even data lines D2, D4, . . . , and Dm are alternatively routed to the upper or lower side of the screen. At this time, odd-even data channel vertical line defect may be generated.

Therefore, embodiments of the present invention provide a landscape type organic light emitting display (or provide a landscape type panel) with structures in which the dead space is reduced and/or the odd-even data channel vertical line defect is prevented. Detailed description thereof will be described with reference to FIGS. 4 and 5.

Figure 4:
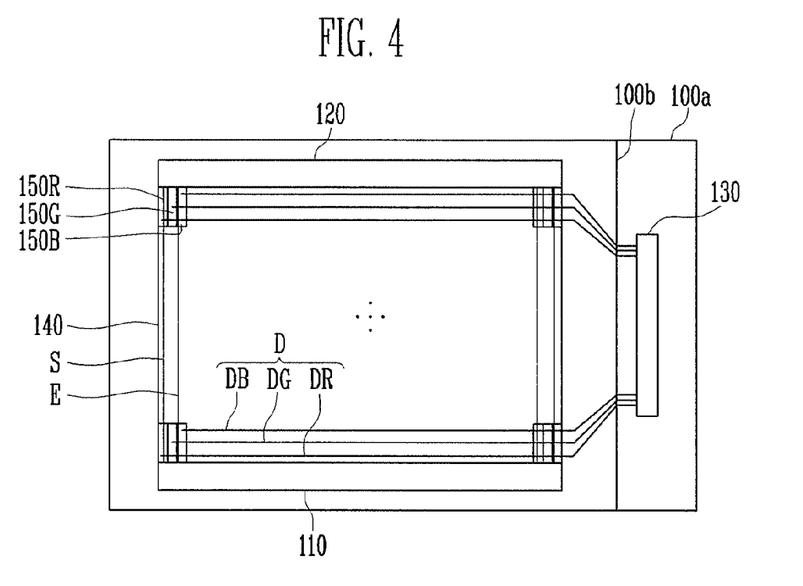
FIG. 4 is a plan view illustrating the panel of an organic light emitting display according to an embodiment of the present invention.
Figure 5:
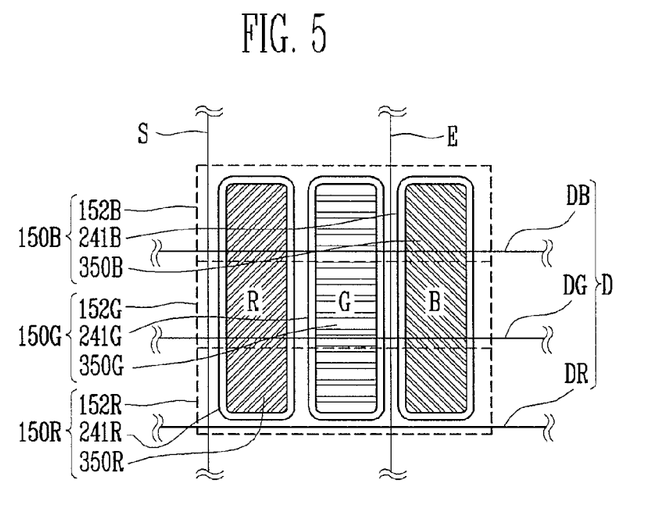
FIG. 5 is an enlarged view illustrating an arrangement of the unit pixel, the scan line, and the data line of FIG. 4 according to an embodiment of the present invention.

FIG. 4 is a plan view illustrating the panel of an organic light emitting display according to an embodiment of the present invention. FIG. 5 is an enlarged view illustrating the arrangement of the unit pixel, the scan line, and the data line of FIG. 4 according to an embodiment of the present invention.

First, referring to FIG. 4, in the organic light emitting display according to the embodiment of the present invention, the scan lines S, the data lines D, and pixel circuit regions in which pixel circuits are formed are designed in the form of a portrait type panel. The scan lines S, the data lines D, and the pixel circuit regions are arranged in the form where the portrait type panel is rotated in a horizontal direction. That is, according to the present invention, the scan lines S are arranged in the vertical direction of the screen realized in the pixel region 140, and the data lines D are arranged in the horizontal direction of the screen.

In this case, the scan driver 110 is arranged in the upper or lower side of the pixel region 140. The data driver 130 is arranged on the left or right side of the pixel region 140. For example, the data driver 130 may be arranged in the non-seal up region of a lower substrate 100a to be positioned on the right side of the seal up region defined by upper and lower substrates 100a and 100b.

Moreover, the emission control lines E for controlling emission time in units of the column lines of the unit pixels including a red pixel 150R, a green pixel 150G, and a blue pixel 150B may be further arranged in the pixel region 140. The emission control lines E may be arranged to run parallel with the scan lines S in the vertical direction of the screen.

In this case, the emission control driver 120 for supplying the emission control signals to the emission control lines E is arranged in the upper or lower side of the pixel region 140. For example, the emission control driver 120 may be arranged to face the scan driver 110 with the pixel region 140 interposed therebetween. The above is only an example, and the present invention is not limited to the above. For example, the scan driver 110 and the emission control driver 120 may be integrally formed with each other on the same side of the pixel region 140 or may be separately formed on both sides of the pixel region 140.

According to the present invention, the anode electrodes of the OLEDs and emission regions corresponding to the anode electrodes of the OLEDs are rotated in the direction orthogonal to the direction of the pixel circuit regions so that the major axes of the anode electrodes of the OLEDs and the emission regions are arranged in the vertical direction orthogonal to (or crossing) the horizontal direction that is the longitudinal direction of the pixel circuit regions.

That is, it is designed that the major axes of the pixels 150R, 150G, and 150B are arranged in the vertical direction based on the emission region so that an image displayed on the screen by the pixels 150R, 150G, and 150B is horizontally displayed.

The above structure is described in more detail with reference to FIG. 5. Here, referring to FIG. 5, in the pixels 150R, 150G, and 150B, the major axes of anode electrodes 241R, 241G, and 241B that constitute the OLEDs and the major axes of pixel circuit regions 152R, 152G, and 152B in which the pixel circuits are formed under the anode electrodes 241R, 241G, and 241B are arranged to intersect (or cross) each other. In this case, the OLEDs and the pixel circuits coupled to the OLEDs are arranged to partially overlap each other.

In particular, in the pixels 150R, 150G, and 150B, the anode electrodes 241R, 241G, and 241B may be patterned in the vertical direction so that the vertical direction is longer than the horizontal direction, and the pixel circuit regions 152R, 152G, and 152B may be designed (configured) in the horizontal direction so that the horizontal direction is longer than the vertical direction.

In this case, emission regions 350R, 350G, and 350B of the pixels 150R, 150G, and 150B are designed (configured) so that the vertical direction is longer than the horizontal direction to correspond to the pattern of the anode electrodes 241R, 241G, and 241B, and the pixels 150R, 150G, and 150B are recognized (realized) as the vertical pattern corresponding to the pattern of the emission regions 350R, 350G, and 350B.

On the other hand, in the unit pixel including at least one red pixel 150R, green pixel 150G, and blue pixel 150B, the red pixel 150R, the green pixel 150G, and the blue pixel 150B of the unit pixel are commonly coupled to the scan line S (or the scan line S and the emission control line E) arranged in the column line where the unit pixel is arranged and are coupled to different data lines among the plurality of data lines DR, DG, and DB arranged in a row line where the unit pixel is arranged. That is, the red pixel 150R is coupled to the red data line DR, the green pixel 150G is coupled to the green data line DG, and the blue pixel 150B is coupled to the blue data line DB.

Here, the anode electrodes 241R, 241G, and 241B of the pixels 150R, 150G, and 150B and the emission regions 350R, 350G, and 350B corresponding to the anode electrodes 241R, 241G, and 241B may overlap each other to intersect (or cross) the at least two data lines among the plurality of data lines DR, DG, and DB.

Moreover, the pixels 150R, 150G, and 150B may be further coupled to an additional control line, for example, CSn illustrated in FIG. 2C according to the structure. In this case, a control line is arranged between the emission region 350R of the red pixel and the emission region 350G of the green pixel of FIG. 5 in the vertical direction to be commonly coupled to the red pixel 150R, the green pixel 150G, and the blue pixel 150B in the unit pixel.

Also, in the pixels 150R, 150G, and 150B, the pixel circuits formed in the pixel circuit regions 152R, 152G, and 152B and the anode electrodes 241R, 241G, and 241B of the OLEDs may be coupled to each other through coupling wiring lines. Source/drain metals used for forming the source/drain electrodes of the transistors included in the pixel circuits or anode metals used for forming the anode electrodes 241R, 241G, and 241B may be used as the coupling wiring lines, which may be suitably changed considering the desired design.

According to the above-described embodiments of present invention, there is provided an organic light emitting display realized as a landscape type organic light emitting display where an image is horizontally displayed on a screen and a dead space is effectively reduced.

In more detail, since the data lines D may be directly coupled from the pixel region 140 to the data driver 130 via a wiring line region (a fan-out region) between the pixel region 140 and the data driver 130 without passing through the upper or lower side of the pixel region 140, the dead space caused by wiring lines is reduced, and the odd-even data channel vertical line defect is prevented. In the above, it is assumed that another driving element is not coupled between the pixel region 140 and the data driver 130, and/or that a data distributing unit is collectively described together with the data driver 140.

In addition, according to an embodiment of the present invention, since the wiring lines and the pixel circuits of the scan lines S and the data lines D may be designed in the same way as the panel of the portrait type organic light emitting display so that all of the pixels 150 arranged along the minor axis direction of the screen can be coupled to the scan lines S, it is not necessary to increase the size of a buffer circuit, which is advantageous to reducing the dead space. Also, according to an embodiment of the present invention, since the data lines D can be coupled to all of the pixels 150 arranged along the major axis direction of the screen, the number of needed channels is reduced in comparison with a comparable landscape type panel so that the size of the data driver 130 may be reduced. In addition, in this case, a conventional portrait type driving circuit chip (a driving IC in which the data driver is mounted) may be directly used so that the driving circuit chip may be commonly used.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. An organic light emitting display, comprising:
a scan driver for supplying scan signals to a plurality of scan lines;
a data driver for supplying data signals to a plurality of data lines; and
a pixel region comprising a plurality of pixels at crossing regions of the scan lines with the data lines, the pixels comprising organic light emitting diodes (OLEDs) and pixel circuits for controlling currents flowing to the OLEDs,
wherein:
the scan lines are arranged to extend along a vertical direction of a screen realized in the pixel region;
the data lines are arranged to extend along a horizontal direction of the screen;
the pixels are unit pixels, each unit pixel comprising a red pixel, a green pixel, and a blue pixel arranged along the horizontal direction
the OLEDs comprise anode electrodes,
the pixel circuits are in pixel circuit regions,
the red pixel, the green pixel, and the blue pixel each comprise an anode electrode of the anode electrodes and a pixel circuit region of the pixel circuit regions, and
the pixel circuit region of the red pixel, the green pixel, or the blue pixel overlaps the anode electrodes of the other pixels of the corresponding one of the unit pixels.
2. The organic light emitting display as claimed in claim 1, wherein, in the pixels, major axes of the anode electrodes and major axes of the pixel circuit regions are arranged to cross each other.

3. The organic light emitting display as claimed in claim 2, wherein the OLEDs and the pixel circuits coupled to the OLEDs are arranged to at least partially overlap each other.

4. The organic light emitting display as claimed in claim 1, wherein, in the pixels, the anode electrodes are arranged in a pattern so that the anode electrodes are longer along the vertical direction than along the horizontal direction; and the pixel circuit regions are configured so that the pixel circuit regions are longer along the horizontal direction than along the vertical direction.

5. The organic light emitting display as claimed in claim 4, wherein emission regions of the pixels are configured so that the emission regions are longer along the vertical direction than along the horizontal direction to correspond to the pattern of the anode electrodes.

6. The organic light emitting display as claimed in claim 1, wherein:
the red pixel, the green pixel, and the blue pixel of the unit pixel are commonly coupled to a same scan line of the scan lines arranged along a column, where the unit pixel is arranged; and
the red pixel, the green pixel, and the blue pixel of the unit pixel are respectively coupled to different data lines of the data lines along a row, where the unit pixel is arranged.

7. The organic light emitting display as claimed in claim 6, wherein the anode electrodes of the OLEDs included in the pixels each cross at least two data lines of the data lines.

8. The organic light emitting display device as claimed in claim 1, wherein the scan driver is arranged in an upper or lower side of the pixel region.

9. The organic light emitting display device as claimed in claim 1, further comprising:
a plurality of emission control lines for controlling emission time of the OLEDs, the emission control lines being configured to extend in parallel with the scan lines in the pixel region; and
an emission control driver for supplying emission control signals to the emission control lines, the emission controller being arranged in an upper or lower side of the pixel region.

10. The organic light emitting display device as claimed in claim 9, wherein the emission control driver is arranged to face the scan driver with the pixel region interposed therebetween.

11. The organic light emitting display as claimed in claim 1, wherein the data driver is arranged on a left or right side of the pixel region.

12. The organic light emitting display as claimed in claim 11, wherein the data lines are directly coupled from the pixel region to the data driver via a wiring line region between the pixel region and the data driver without passing through an upper or lower side of the pixel region.

13. The organic light emitting display as claimed in claim 1, wherein:
the scan lines, the data lines, and pixel circuit regions, where the pixel circuits are formed, are configured as a portrait type panel, and the portrait type panel is configured to be rotated to extend along a horizontal direction; and
a major axis of the anode electrodes of the OLEDs positioned on the pixel circuit regions and a major axis of emission regions corresponding to the anode electrodes are rotated in a direction orthogonal to a major axis of the pixel circuit regions to horizontally display an image on the screen.

14. The organic light emitting display as claimed in claim 1, wherein the pixel region comprising the plurality of pixels is configured to display an image on the screen realized in the pixel region in a landscape orientation.

* * * * *

UNITED STATES PATENT AND TRADEMARK OFFICE
CERTIFICATE OF CORRECTION

| | | |
|---|---|---|
| PATENT NO. | : 8,508,438 B2 | Page 1 of 1 |
| APPLICATION NO. | : 12/856551 | |
| DATED | : August 13, 2013 | |
| INVENTOR(S) | : Mi-Sook Suh | |

It is certified that error appears in the above-identified patent and that said Letters Patent is hereby corrected as shown below:

In the Claims

Col. 8, line 55, Claim 1 — Delete "direction",
Insert --direction;--

Col. 10, lines 2-3, Claim 9 — Delete "controller",
Insert --control driver--

Signed and Sealed this
Twenty-third Day of December, 2014

Michelle K. Lee
*Deputy Director of the United States Patent and Trademark Office*